United States Patent
Mneimneh et al.

(12) 
(10) Patent No.: US 10,387,605 B2
(45) Date of Patent: Aug. 20, 2019

(54) SYSTEM AND METHOD FOR MANAGING AND COMPOSING VERIFICATION ENGINES

(71) Applicant: Synopsys, Inc., Mountain View, CA (US)

(72) Inventors: Maher Mneimneh, San Jose, CA (US); Scott Cotton, Saint Martin d'Heres (FR); Mohamed Shaker Sarwary, San Diego, CA (US); Fahim Rahim, Lyons (FR); Sudeep Mondal, New Delhi (IN); Paras Mal Jain, Greater Noida (IN)

(73) Assignee: Synopsys, Inc., Mountain View, CA (US)

( * ) Notice: Subject to any disclaimer, the term of this patent is extended or adjusted under 35 U.S.C. 154(b) by 656 days.

(21) Appl. No.: 14/807,676

(22) Filed: Jul. 23, 2015

(65) Prior Publication Data

US 2017/0024508 A1    Jan. 26, 2017

(51) Int. Cl.
*G06F 17/50* (2006.01)

(52) U.S. Cl.
CPC ........ *G06F 17/5081* (2013.01); *G06F 17/504* (2013.01)

(58) Field of Classification Search
CPC .................. G06F 17/5081; G06F 17/504
USPC ....................................... 716/106
See application file for complete search history.

(56) References Cited

U.S. PATENT DOCUMENTS

| | | |
|---|---|---|
| 6,077,304 A * | 6/2000 | Kasuya ............... G06F 17/5022 703/14 |
| 6,339,837 B1 | 1/2002 | Li |
| 6,698,003 B2 | 2/2004 | Baumgarwtner et al. |
| 7,093,218 B2 | 8/2006 | Baumgartner et al. |
| 7,266,795 B2 | 9/2007 | Baumgartner et al. |
| 7,779,378 B2 | 8/2010 | Baumgartner et al. |
| 7,856,609 B2 | 12/2010 | Baumgartner et al. |
| 7,913,208 B2 | 3/2011 | Baumgartner et al. |
| 8,589,837 B1 | 11/2013 | Baumgartner et al. |
| 8,601,433 B2 | 12/2013 | Son et al. |
| 8,612,905 B1 | 12/2013 | Goyal et al. |
| 2013/0290918 A1 | 10/2013 | Baumgartner et al. |

FOREIGN PATENT DOCUMENTS

CN    1710567 A1    7/2005

* cited by examiner

*Primary Examiner* — Jack Chiang
*Assistant Examiner* — Brandon Bowers
(74) *Attorney, Agent, or Firm* — Fenwick & West LLP

(57) ABSTRACT

A system and method for managing and composing verification engines and simultaneously applying such compositions to verify properties with design constraints allocates computing resources to verification engines based upon properties to be checked and optionally a user-specified budget. The verification engines are run in order to verify a received register transfer level (RTL) design description of a circuit according to user-specified assertions and constraints received by the system. The particular verification engines to be run are selected from a database of such engines and a run order is designated in sequential, parallel and distributed flows.

21 Claims, 3 Drawing Sheets

SYSTEM AND METHOD FOR MANAGING AND COMPOSING VERIFICATION ENGINES

TECHNICAL FIELD

This invention relates to the field of integrated circuits verification and in particular to formal verification of design properties under user-specified design constraints. More particularly the invention relates to a system, method and computer program product for managing and composing verification engines and simultaneously applying such compositions to design properties.

BACKGROUND ART

The relentless increase in the number of transistors integrated on a single electronic chip has made the traditional method of chip verification using simulation more and more difficult and time-consuming. Desiring additional measures of design confidence, chip developers are increasingly turning to other methods of verification to augment simulation.

Formal verification delivers mathematical proofs of correctness without requiring simulation test bench development. Formal verification processes properties defining intended behavior and makes use of constraints that specify legal input values for the design. Properties can be defined by the chip designer in the form of assertion statements. Properties can also be automatically extracted by electronic design automation (EDA) tools. Automatically extracted properties usually apply to a specific domain such as clock-domain crossing (CDC), power verification, timing exception verification among others. To correctly model the environment of a design, designers specify constraints in SVA/PSL or other standard formats. The constraints are usually referred to as assumptions while the properties to be proved as assertions.

Properties are verified using verification engines. Due to the computational complexity of the verification problem, many verification engines exist and improved verification engines continue to be developed. Different verification engines tackle the verification problem differently to circumvent the computational difficulty of the verification process. Different engines have memory and runtime characteristics that cannot be predicated beforehand. Consequently, it is difficult to predict whether a specific verification engine can prove a specific property or how long it will take. For this reason, engineers want to run multiple verification engines until one succeeds and to be able to limit the computing resources used by each verification engine. In addition, engineers want to be able to quickly integrate state-of-the-art verification engines into their products. Most verification engines process one property at a time.

Baumgartner is an early pioneer in the field of formal verification and in U.S. Pat. Nos. 6,698,003 and 7,266,795 describes a Verification framework that uses multiple specialized engines to decompose a design into smaller pieces, pass information between engines and prove a single property cooperatively. The specialized engines have complex interactions and have no limits on their computation resources.

EDA tools need a framework that can easily incorporate new verification engines with minimal effort, provides ways of composing verification engines so they can run serially and in parallel, with user-specified computing resources.

SUMMARY DISCLOSURE

A system and method are provided for managing and composing verification engines and simultaneously applying such compositions to a group of properties and a group of design constraints to verify properties with design constraints. Properties may be automatically extracted from a Register-Transfer level (RTL) design description. Constraints are provided by a user and typically specified in a constraint language. The system allocates computing resources based on a user-specified budget, e.g. one that places limits on the runtime (both CPU and wall clock time), memory, and number of CPUs in a verification task.

The system may use a client-server architecture that simplifies communication and provides centralized management of result reporting. The system employs an interface to the verification engines that makes it easy to integrate new engines, and compose verification engines in sequential, parallel and distributed flows. For example, the interface could allow extension of the set of engines by simply plugging a new engine in place. The interface is coupled with a callback mechanism to report back the results of dispatched assertions.

The interface supports the following types of compositions:

a. In a sequential composition, multiple verification engines are composed in series where an engine will not run till all prior engines complete their run without concluding the status of the properties;

b. In a data parallel flow, a set of properties is partitioned into multiple groups that are run in parallel;

c. In a process parallel flow, a set of engines are run in parallel on the same property;

d. A distributed composition is similar to a data parallel flow or the process parallel flow, but engines are run on different machines;

e. A choice based composition allows condition-based property dispatching where a user can provide a condition based on which a set of properties will be sent to a specific engine; and

DETAILED DESCRIPTION

Figure 1:
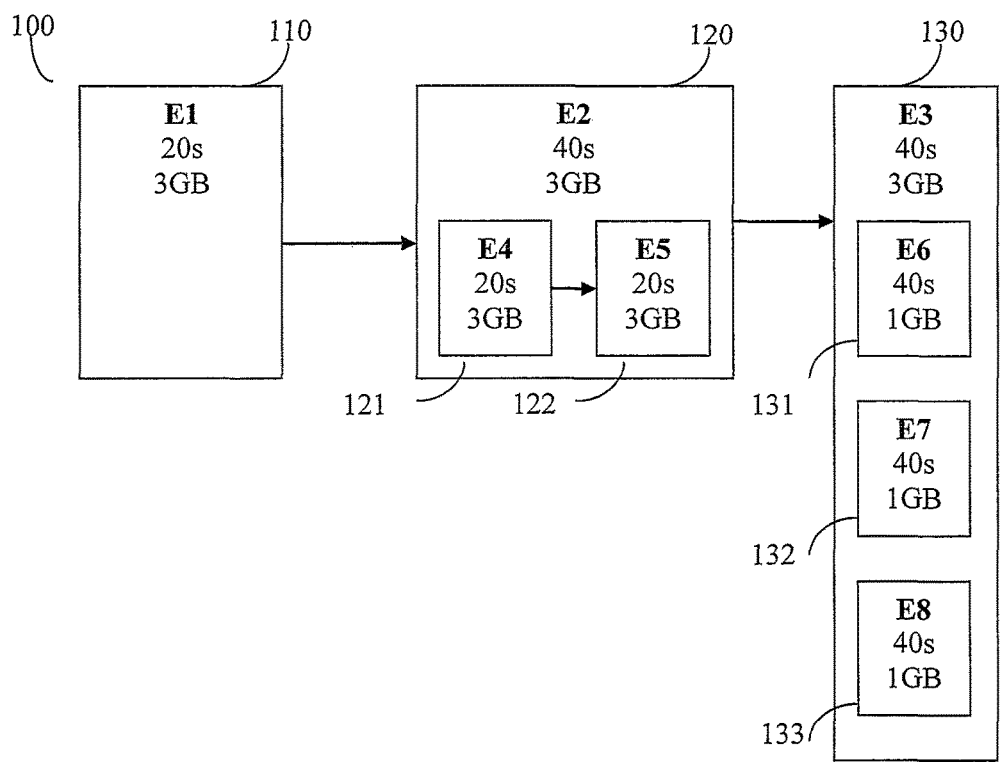
FIG. 1 shows an example verification engine composition with allocated resources.

Some reference terms:

a) Verification Engine (VE): A VE is a software verification program that tries to prove or disprove a property. VEs are also called "formal engines", "formal verification engines", and "invariant checkers". There are many types of VEs and the framework can invoke multiple instances of the same and different types.

b) Property: A property is also known as an assertion. A property is a description of a specific behavior for a net or a set of nets in a design.

c) Constraint: A constraint specifies a set of conditions associated with a property. It specifies assumptions of design behavior on specific nets.

d) Verification Framework (VF): A framework for management and composing verification engines and simultaneously applying such compositions to a group of properties and a group of design constraints.

e) Composition: A composition is a schedule describing ways to combine VE execution. The composition can be serial, parallel, or conditional.
f) Property Group (PG): A PG is a subset of the properties in a design. It is also referred to as a "pack".
g) Client-Server Architecture (CSA): An architecture where processes or processors act as either a client or a server. Communication occurs between clients and servers. The server generally controls shared resources.
h) End-User (EU): An end-user of the VF. The EU supplies the design, constraints, and budget.

A verification framework (VF) provides a way of easily incorporating new verification engines (VEs) with minimal effort, provides ways of composing and dynamically selecting VEs so they can run serially and in parallel, and limits computing resources such as memory, CPU time, elapsed time and number of processes/machines used. The VF has a simple communication interface with each VE making it easy to incorporate new VEs. The VF passes the design or part of the design, one or more properties, design constraints and computing resource constraints to the VE and commands the VE to start execution. When the VE finishes execution the VE reports its results back to the VF. The VE communicates that the property it analyzed has a) been proven (i.e., the property is valid); b) failed (the property is invalid) or c) been partially-proven (i.e., the engine ran out of resources and couldn't conclude the analysis). The VE may optionally accept a command to terminate its current execution. In the case where the VF starts multiple VEs on a given property, the VF terminates a VE execution when it discovers that a different VE has successfully proven that property.

The VF accepts verification tasks from an end-user. The end-user specifies the design, properties, constraints and a computing resource budget. The design is usually specified in RTL files and written in Verilog/SystemVerilog or VHDL. The properties and constraints are usually specified in files and written in languages such as System Verilog Assertions (SVA), Open Verification Library (OVL) or Property Specification Language (PSL). Properties can be specified manually or generated by EDA tools like SpyGlass. Typical properties include:
1. Clock domain crossing properties, for example a check that data transferred from source to destination, where the source and destination have different clocks, does not lose any information and is coherent.
2. Timing exception verification properties, which check that a path is permanently false or false for a given number of clock cycles.
3. Sequential equivalence checking properties, which check that a reference design is equivalent to an implementation (which may be optimized in some way with respect to the reference design). The properties check that interface level nets are equivalent between the 2 designs.
4. Design properties that check for example that a first-in-first-out (FIFO) buffer never overflows or underflows, or that a finite-state-machine (FSM) satisfies reachability properties on its states.

Design constraints can be specified manually and can also be generated by EDA tools like SpyGlass to more faithfully represent the functional behavior of the design. Typical constraints include:
1. Clock constraints indicating the frequency and phase or waveform of a net which is a clock.
2. Reset constraints indicating that the design has been reset and is operating in a steady state.
3. Combinational Loop stability constraints indicating that a combinational loop is stable.
4. System Verilog Assumptions that provide assumptions on design behavior (for example exclusivity of 2 signals).

The VF receives a set of properties as one property group together with a set of design constraints.

Typical verification engines include:
1. "Sat Witness". This engine can find bounded counterexamples. It is capable of exploiting shared nets when presented with multiple verification tasks at once. It cannot generally provide a proof of a property.
2. "Reach". This engine is efficient for finding proofs and counterexamples of designs with relatively small number of latches/registers. It runs out of memory quickly on medium-large designs.
3. "IND". IND extends a typical "Sat Witness" engine with additional checks so that it can generate a proof (in addition to a fail) or a property. For some classes of properties, IND is the fastest engine available for finding proofs.
4. "IP". For properties which take less than a few seconds to prove, IP is often the fastest way to prove them. Thus IP provides high throughput proofs of relatively easy properties. IP can generate counterexamples as well, but not as efficiently as "Sat Witness".
5. "IC3". IC3 is a general purpose engine which excels at finding proofs. It can also find counterexamples which in some cases are too long/deep for "Sat Witness" to find, because it does not always need to represent the full design to the depth of the counterexample.

The VF checks the consistency of the constraints and reports any contradictory signal values. If the constraints are consistent the VF selects a VE composition, allocates resources to VEs, starts VE execution and reports verification results. The VE composition defines the order of execution of VEs. The VE composition consists of serial and parallel elements, where each element can define further serial or parallel elements. The leaf elements have an associated VE. The VF supports sequential, conditional, data-parallel, engine-parallel and abstraction compositions of VEs.

A data-parallel composition runs multiple instances of the same VE simultaneously, where each VE instance processes a different subset of properties. An engine-parallel composition runs different VEs simultaneously processing the same properties. The VF refers to the VE composition when it starts VE execution and makes some run-time decisions. For example, the VF may start fewer parallel tasks than indicated in the VE composition if the maximum number of processes is exceeded. The VF keeps track of which properties have been proven and does not ask a VE to process an already proven property.

The VF has multiple ways of selecting a composition. In one mode the VF automatically selects from a set of pre-specified engine compositions based on design and resource attributes. Such pre-specified VE compositions have been extensively benchmarked on a large set of properties. The VF make a selection by matching attributes of the design such as the number of latches/registers and the specified computing resources, such as the number of CPUs, against the attributes of the available pre-specified compositions. The pre-specified composition attributes include
    resource attributes such as run-times requirements, memory requirements and number of processors
    property attributes such as the number of latches/registers and the size of the properties
    design attributes such as clock-domain crossing or timing exception properties intent attributes such as the user intent to generate a proof or a failure In one mode the VF uses pre-defined rules that specify which composition to use for combinations of the above attribute values. In a second mode a a composition is directly specified by an end-user of the VF. In this mode, users of the VF can control the composition of the engines from a script, from an application program using the VF API, or a mixture of the two.

A single core composition always runs engines in sequence rather than in parallel. In this context, it is important that an engine which excels at solving the common case be first in the sequence. Since the user will often use the VF in a loop where errors from property failures are analyzed and eliminated until the user gets a proof, we want an engine which excels at finding failures to run first. Consequently a single core composition is configured to achieve this. An example of a single core composition for the entire set of properties would be:

If the number of latches for the set of properties is not too big then run VE1 with 100% of supplied time. Otherwise, run VE2 for 25% of supplied time followed by VE3 for 25% of supplied time, followed by VE4 for 50% of supplied time. VE1, VE2, VE3 and VE4 are VEs chosen from the set specified above. VE1, VE2, VE3 and VE4 could be "reach", "ind", "ip" and "ic3".

A multi-core composition can provide a speedup for getting proofs without sacrificing the speed of getting failures. Assume that we have 100 properties with no memory limits that we would like to verify in parallel. An example composition divides the 100 properties into 4 subgroups of 25 properties. The VF runs all subgroups in parallel. The VF allocates the user-specified time to each subgroup. Each subgroup then proceeds in sequence, one property at a time, over the 25 properties assigned to it. We now describe the example sub-composition used for each property, one at a time. As in the single core case, the VF checks if the number of latches is not too big. If it is not too big, the VF runs engines that are tailored for properties with a small number of latches. Otherwise, the problems are too big for these engines to resolve efficiently. In this case, the VF runs multiple engines on the property at hand by efficiently distributing the time across those engines. Such an efficient distribution is derived from a large set of benchmarks.

With parallel composition, the user doesn't have to wait for a specific engine to complete before getting a proof from another. As long as all subgroups are not fully resolved, the VF processes 4 properties simultaneously. The speedup from parallel processing may exceed the speedup resulting from sending multiple properties to a VE in one go. In one embodiment, the maximum number of engines running in parallel for a given property is 2, and the max number of properties being processed at a time is 4. This means the VF will generally keep 8 cores busy with this composition.

FIG. 1 is a diagram 100 showing a sample VE composition with resources allocated. The composition consists of 3 serial elements: element E1 110, element E2 120 and element E3 130. The VF will first execute the VE associated with E1 110. After the VE associated with E1 110 has finished the VF will execute the VE or VEs associated with E2 120. After the VE associated with E2 120 has finished the VF will execute the VE or VEs associated with E3 130. Element E1 110 represents a single VE. Elements E2 120 and element E3 130 represent composite elements. Element E2 120 consists of 2 serial elements: element E4 121 and element E5 122. Element E3 130 consists of 3 data-parallel elements: element E6 131, element E7 132 and element E8 133. The VF will execute the VE associated with E1 110, the VE associated with E4 121, the VE associated with E5 122 and then simultaneously start the execution of the VEs associated with E6 131, E7 132 and E8 133.

FIG. 1 shows how the VF allocates resources. For this example an end-user has assigned a budget of 100 seconds of elapsed time, 3 GB of memory, and a maximum of 3 processes on a machine with 4 cores. The VF allocates the elapsed time among the serial elements. In this example the VF assigns the elapsed time budget to serial elements E1 110, E2 120, and E3 130 in the ratio 1:2:2. Thus E1 110 has a budget of 20 seconds, E2 120 has a budget of 40 seconds and E3 130 has a budget of 40 seconds. The VF further divides the E2 120 budget of 40 seconds into a budget of 20 seconds for E3 121 and 20 seconds for E4 122. The VF assigns the parallel elements E6 131, E7 132, and E8 133 the same amount of time as their composite element E3 130. VEs will further divide the elapsed time budget as needed. A VE which can exploit sharing can divide up the budget in such a way as to spend time doing work shared between several properties. A VE which is not able to exploit redundancy in a set of properties will always allocate the budget on a per-property basis. In addition to allocating elapsed time, the VF allocates memory between parallel elements. In this example the VF assigns 1 GB of memory to each of the parallel elements E6 131, E7 132, and E8 133.

Figure 2:
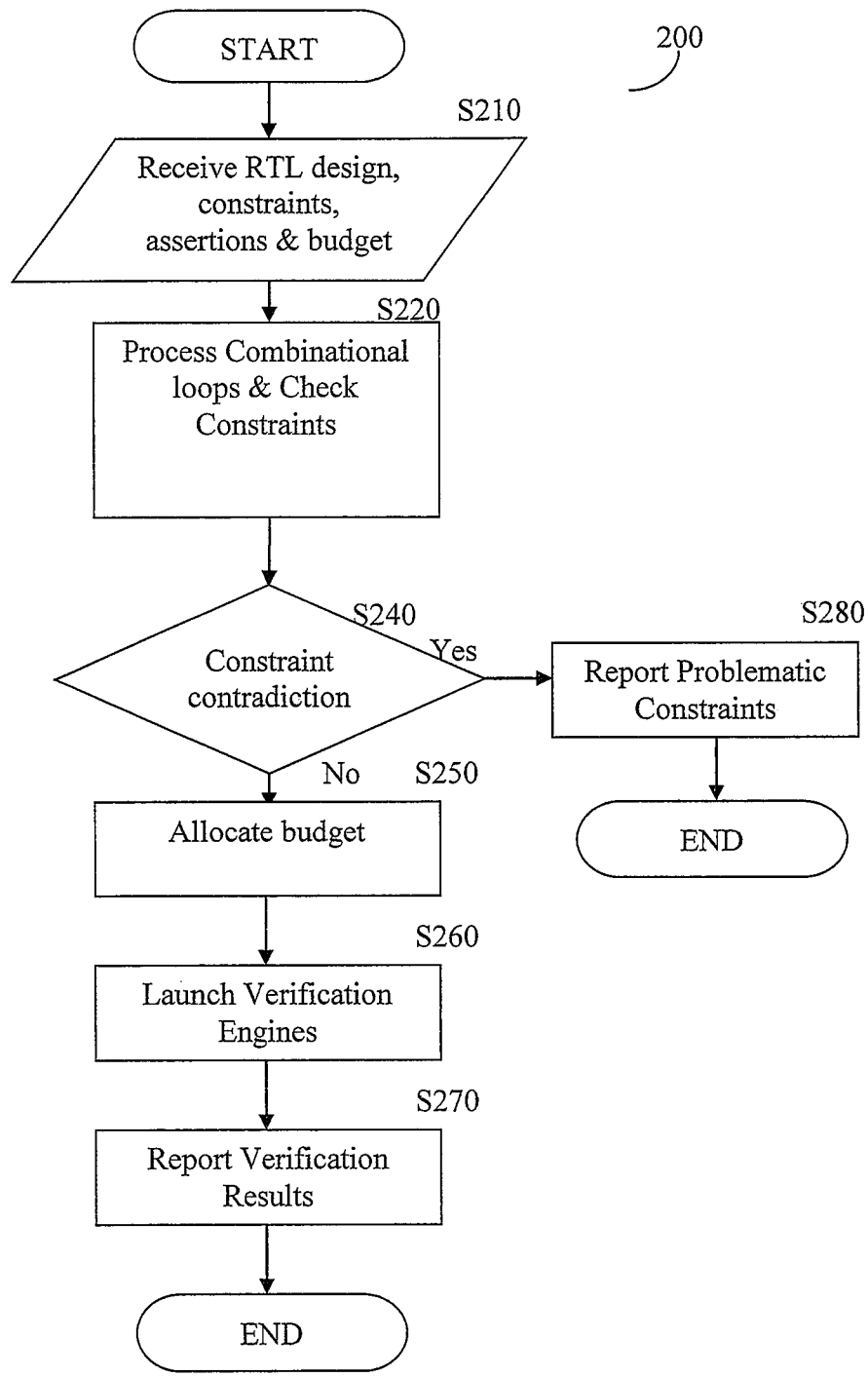
FIG. 2 shows a flowchart outlining the steps of the verification framework.

FIG. 2 is an exemplary and non-limiting flowchart 200 outlining the steps of the verification framework. In S210 the VF receives the RTL design, the resource budget and the design constraints. The resource budget specifies a) the maximum amount of elapsed time that the VF may spend; b) the maximum amount of CPU time that the VF may spend; c) the maximum amount of memory that the VF may use; and d) the availability of CPU cores that the VF may use. In one embodiment, the end-user specifies only one of the maximum elapsed time and the maximum CPU time. The design constraints specify assumptions that the VE can take advantage of when proving a property. Design constraints typically specify legal values of input signals but can constrain the values of internal signals.

In S220 the VF analyzes combinational loops and user constraints for stability and consistency. This check is required since if two or more constraints indicate contradictory values for some signals, the verification step cannot continue; the user must resolve the conflict by modifying the constraints, the RTL or both. In S240 the VF checks if any constraint inconsistencies were found. If the VF found one or more constraint inconsistencies, the VF proceeds to S280. If the VF did not find any constraint inconsistencies, the VF proceeds to S250. In S280 the VF reports constraint inconsistencies and shows the user the constraints that are causing the conflict; the user must resolve the conflict before the verification process is resumed. After reporting constraint inconsistencies in S280, the VF terminates.

In S250 the VF selects an engine composition and allocates resources. The VF selects an engine composition specified in the script or API call if possible. If the VF does not receive an explicit engine composition via script or API call the VF selects an engine composition based on attributes of the properties. The VF divides elapsed-time and/or CPU time among serial elements. The VF divides CPU time among parallel elements but keeps the same elapsed time. The VF divides the memory among parallel elements running on separate CPU cores of the same machine. The engine composition may specify sequential, conditional, data-parallelism or engine-parallelism. In data-parallelism, the VF will divide the properties into groups and start parallel processes operating on different property groups. In engine-parallelism the VF starts parallel processes with each process executing a different VE.

A choice based composition allows condition-based property dispatching where a condition indicates which a set of properties will be sent to a specific engine. For example, if the number of sequential elements is less than a certain count, dispatch the property to engine E1; otherwise dispatch the property to engine E2. Conditions are based on structural property attributes (e.g., nature of property, number of combinational/sequential elements, depth . . . ). In an abstraction composition, a property can be abstracted with different types of smart structural abstraction techniques that convert some signals to primary inputs based on various relevant property attributes. An abstraction engines modifies the design and the VF passes the modified design to subsequent composition elements.

In S260 the VF launches the VEs as processes. The VF launches serial elements in order after the previous element has finished. The VF launches parallel elements at the same time ensuring that the maximum number of processes is not exceeded. The VF keeps track of each property's verification results. Once a property has been proven, subsequent processes need not attempt that property. When a VE process proves a property it signals the result to the VF. The VF signals information about proven properties to parallel properties so that the parallel process can terminate processing of proven properties.

In S270 the VF reports the verification results to the end-user. The verification results indicate which properties were proved, failed and partially-proved.

Figure 3:
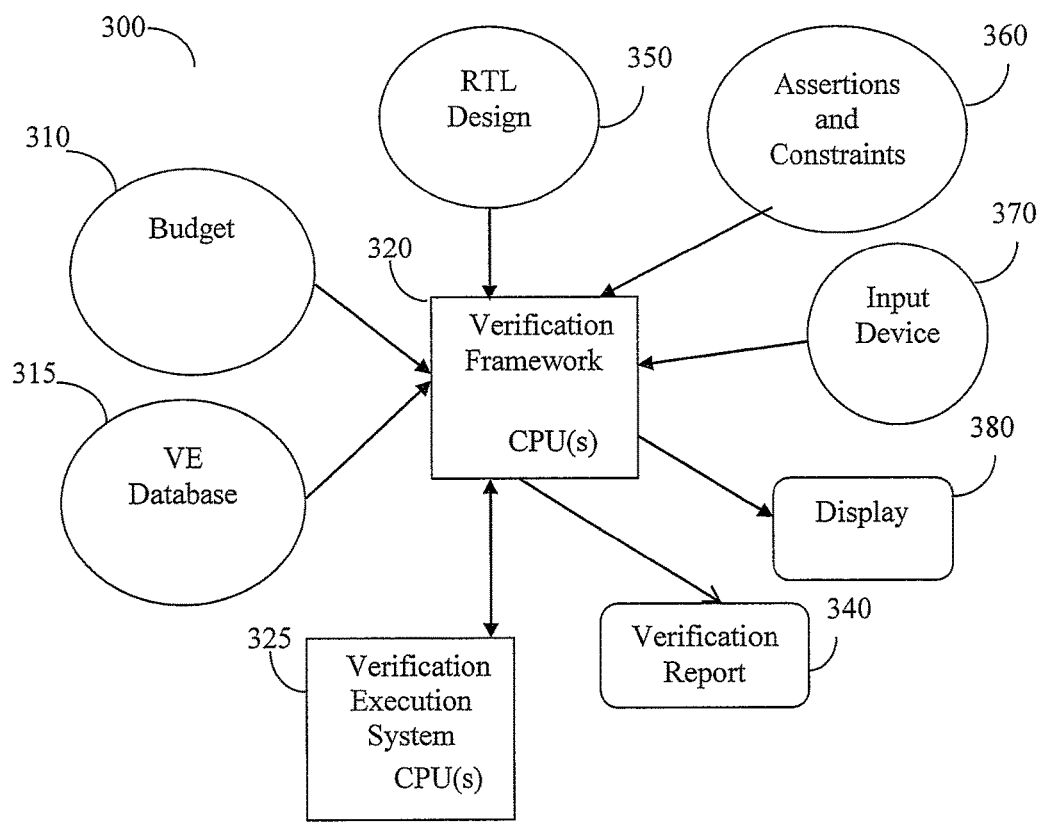
FIG. 3 shows a block diagram of a verification framework.

FIG. 3 is an exemplary and non-limiting diagram 300 showing a verification framework (VF) 320. The VF 320 runs as an application program on a central processing unit (CPU). The VF 320 interacts with an end-user through an input device 370 and a display 380. In one embodiment the VF 320 displays verification results on the display, 380. An end-user specifies VF inputs, starts the VF 320 and views results using the input device 370 and display 380. An end-user views verification results on the display 380. The VF 320 reads a resource budget 310, an RTL design 350 and design constraints 360. In one embodiment the budget is contained in a file. In another embodiment the VF prompts the user to enter the budget. The RTL design 350 and design constraints 360 are stored in files on a computer storage device. In one embodiment the VF 320 stores the verification results in a file as a report 340.

The VF 320 controls and interacts with a Verification Execution System 325. The VF 320 composes a schedule for running VEs to prove the design assertions in 360. The VF directs the Verification Execution System 325 to prove the design assertions in 360 by executing VEs in the order of the composed schedule. The VEs are software applications running on one or more CPUs of the Verification Execution System 325. In one embodiment the VF 320 and Verification Execution System 325 run on the same single-core or multi-core CPU and share the same files and memory. In this embodiment the VF 320 spawns processes or threads to execute the VEs. In a second embodiment the Verification Execution System 325 runs on one or more single-core or multi-core CPUs. In this second embodiment the VF 320 executes remote shell calls to start VE execution on the Verification Execution System 325. In this second embodiment the VF 320 communicates with the Verification Execution System 325 by using a shared file system or by copying data files.

In one embodiment the VF 320 reads information about VEs and VE composition templates from a VE database 315. The VE database 315 lists attributes of the VEs including run-time behavior, memory requirement, ability to handle large numbers of latches/registers, and ability to generate proofs. A composition template defines a commonly-used sequence of VE operations. The VE database 315 lists similar attributes of the composition templates. The VE database 315 is stored on a storage medium such as a disk file. In a second embodiment the VF320 maintains the VE database as data structures within its application program.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

What is claimed is:

1. A method executed by a computing system for managing and composing verification engines and simultaneously applying such compositions to a group of properties and a group of design constraints upon an integrated circuit design, comprising:
   storing verification engines in a database accessible to the computing system;
   receiving and storing a register transfer level (RTL) description of at least a portion of an integrated circuit design;
   receiving and storing a set of properties and constraints to be applied in a verification of the received RTL description;
   receiving a set of attributes for the verification;
   selecting by the computing system from the database a composition of verification engines to be run according to the received constraints and properties, wherein the composition of verification engines is selected from a set of pre-specified compositions based on pre-defined rules that match the set of received attributes for the verification against attributes of the pre-specified compositions; and
   running the selected verification engines by the computing system in an order designated by the selected composition so as to obtain verification results for the properties.

2. The method as in claim 1, wherein the verification engine database is extendible by addition of new verification engines thereto.

3. The method as in claim 1, wherein the selecting of verification engines and designation of run order is according to any of the following composition types:

a) a sequential flow wherein multiple verification engines are run in series with each successive engine not beginning its run until run completion of its prior engine in the series;
b) a data parallel flow wherein a set of properties is partitioned into multiple groups, verification engines corresponding to the different groups being run in parallel;
c) a process parallel flow wherein multiple verification engines are run on the same set of properties in parallel; and
d) a condition-based property dispatching wherein a user-provided condition specifies which set of properties will be sent to a specific verification engine.

4. The method as in claim 3, wherein, for the selected composition, the computing system chooses correct parameters based on user-defined criteria or property-specific criteria.

5. The method as in claim 1, wherein the pre-defined rules specify which pre-specified composition to use for different combinations of received attributes.

6. The method as in claim 1, further comprising:
once one of the properties has been proven by one of the verification engines, other verification engines that would attempt to prove that property are not run.

7. The method as in claim 1, wherein the set of pre-specified compositions includes at least one each of a single core composition, a multi-core composition, and a parallel composition.

8. The method as in claim 1, wherein the set of pre-specified compositions includes at least one single core composition in which a verification engine that proves a common case is designated to run first.

9. The method as in claim 1, wherein the attributes of the pre-specified compositions include run-time requirements, memory requirements and/or number of processors used for the verification.

10. The method as in claim 1, wherein the attributes of the pre-specified compositions include a number of latches and/or registers in the received portion of the integrated circuit design.

11. The method as in claim 1, wherein the attributes of the pre-specified compositions include attributes of the properties.

12. The method as in claim 1, wherein the attributes of the pre-specified compositions include a size of the properties.

13. The method as in claim 1, wherein the attributes of the pre-specified compositions include clock-domain crossing and/or timing exception properties.

14. The method as in claim 1, wherein the attributes of the pre-specified compositions include intent to generate a proof and/or intent to generate a failure.

15. A computing system executing management and composition of verification engines and simultaneous application of such compositions to a group of properties and a group of design constraints upon an integrated circuit design, the system comprising:
at least one system processor;
a database of stored verification engines that is accessible to the system processor;
a data store for a register transfer level (RTL) description of at least a portion of an integrated circuit design, and for a set of properties and constraints to be applied in a verification of the RTL description, the data store also accessible to the system processor; and
at least one input device for receiving the RTL description, the set of properties and constraints, and a set of attributes for the verification;
wherein the processor, upon receiving the RTL description, the set of properties and constraints, and the set of attributes for the verification: selects from the database a composition of verification engines to be run according to the received constraints and properties, wherein the composition of verification engines is selected from a set of pre-specified compositions based on pre-defined rules that match the set of received attributes for the verification against attributes of the pre-specified compositions, and runs the selected verification engines in an order designated by the selected composition so as to obtain verification results for the properties.

16. The system as in claim 15, implemented in a client-server architecture.

17. The system as in claim 16, wherein the client-server architecture includes a callback mechanism to report back results of dispatched properties from running the verification engines to a server.

18. The system as in claim 15, wherein the verification engine database is extendible by addition of new verification engines thereto at any time.

19. The system as in claim 15, wherein the selecting of verification engines and designation of run order is according to any of the following composition types:
a) a sequential flow wherein multiple verification engines are run in series with each successive engine not beginning its run until run completion of its prior engine in the series;
b) a data parallel flow wherein a set of properties is partitioned into multiple groups, verification engines corresponding to the different groups being run in parallel;
c) a process parallel flow wherein multiple verification engines are run on the same set of properties in parallel;
d) a condition-based property dispatching wherein a user-provided condition specifies which set of properties will be sent to a specific verification engine.

20. The system as in claim 19, wherein, for the selected composition, the system processor chooses correct parameters based on user-defined criteria or property-specific criteria.

21. A method executed by a computing system for managing and composing verification engines and simultaneously applying such compositions to a group of properties and a group of design constraints upon an integrated circuit design, comprising:
storing verification engines in a database accessible to the computing system;
receiving and storing a register transfer level (RTL) description of at least a portion of an integrated circuit design;
receiving and storing a set of properties and constraints to be applied in a verification of the received RTL description;
receiving a set of attributes for the verification; and
selecting by the computing system from the database a composition of verification engines to be run according to the received constraints and properties, wherein the composition of verification engines is selected from a set of pre-specified compositions based on pre-defined rules that match the set of received attributes for the verification against attributes of the pre-specified compositions.

* * * * *